United States Patent
Adkisson et al.

(10) Patent No.: US 9,478,615 B2
(45) Date of Patent: Oct. 25, 2016

(54) BLANKET SHORT CHANNEL ROLL-UP IMPLANT WITH NON-ANGLED LONG CHANNEL COMPENSATING IMPLANT THROUGH PATTERNED OPENING

(71) Applicant: GLOBALFOUNDRIES INC., Grand Cayman (KY)

(72) Inventors: James W. Adkisson, Jericho, VT (US); Brent A. Anderson, Jericho, VT (US); Andres Bryant, Burlington, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 40 days.

(21) Appl. No.: 14/493,749

(22) Filed: Sep. 23, 2014

(65) Prior Publication Data

US 2015/0041904 A1    Feb. 12, 2015

Related U.S. Application Data (62) Division of application No. 13/289,051, filed on Nov. 4, 2011, now Pat. No. 8,900,954.

(51) Int. Cl.
*H01L 29/10* (2006.01)
*H01L 21/28* (2006.01)
(Continued)

(52) U.S. Cl.
CPC ..... *H01L 29/1041* (2013.01); *H01L 21/28026* (2013.01); *H01L 29/0847* (2013.01); *H01L 29/1045* (2013.01); *H01L 29/36* (2013.01);
(Continued)

(58) Field of Classification Search
CPC .................... H01L 29/6659; H01L 29/66583; H01L 29/1045; H01L 29/66537; H01L 29/0847; H01L 29/1041; H01L 29/78; H01L 29/28026; H01L 21/2652
USPC .......................................................... 257/402
See application file for complete search history.

(56) References Cited

U.S. PATENT DOCUMENTS 5,171,713 A    12/1992 Matthews
5,593,907 A    1/1997 Anjum et al.
(Continued)

OTHER PUBLICATIONS

U.S. Appl. No. 13/289,051, Office Action Communication dated Jul. 11, 2013, 7 pages.
(Continued)

*Primary Examiner* — Phat X Cao
*Assistant Examiner* — Nga Doan
(74) *Attorney, Agent, or Firm* — Gibb & Riley, LLC; Michael J. LeStrange, Esq.

(57) ABSTRACT

A method that forms a structure implants a well implant into a substrate, patterns a mask on the substrate (to have at least one opening that exposes a channel region of the substrate) and forms a conformal dielectric layer on the mask and to line the opening. The conformal dielectric layer covers the channel region of the substrate. The method also forms a conformal gate metal layer on the conformal dielectric layer, implants a compensating implant through the conformal gate metal layer and the conformal dielectric layer into the channel region of the substrate, and forms a gate conductor on the conformal gate metal layer. Additionally, the method removes the mask to leave a gate stack on the substrate, forms sidewall spacers on the gate stack, and then forms source/drain regions in the substrate partially below the sidewall spacers.

20 Claims, 4 Drawing Sheets

(51) Int. Cl.
*H01L 29/66* (2006.01)
*H01L 29/08* (2006.01)
*H01L 29/36* (2006.01)
*H01L 29/78* (2006.01)
*H01L 21/265* (2006.01)

(52) U.S. Cl.
CPC ..... *H01L 29/6659* (2013.01); *H01L 29/66537* (2013.01); *H01L 29/66583* (2013.01); *H01L 29/78* (2013.01); *H01L 21/2652* (2013.01); *H01L 21/26586* (2013.01)

(56) References Cited

U.S. PATENT DOCUMENTS

| | | | |
|---|---|---|---|
| 5,932,919 A | 8/1999 | Schwalke | |
| 5,989,963 A | 11/1999 | Luning et al. | |
| 6,020,244 A | 2/2000 | Thompson et al. | |
| 6,083,781 A | 7/2000 | Zolper et al. | |
| 6,096,586 A | 8/2000 | Milic-Strkalj et al. | |
| 6,426,278 B1 | 7/2002 | Nowak et al. | |
| 6,452,236 B1 | 9/2002 | Nadakumar et al. | |
| 6,465,315 B1 | 10/2002 | Yu | |
| 6,501,131 B1 | 12/2002 | Divakaruni et al. | |
| 6,548,361 B1 | 4/2003 | En et al. | |
| 6,586,288 B2 | 7/2003 | Kim et al. | |
| 6,627,488 B2 | 9/2003 | Lee | |
| 6,653,686 B2 | 11/2003 | Wann | |
| 6,700,160 B1 | 3/2004 | Merchant | |
| 6,815,285 B2 | 11/2004 | Choi et al. | |
| 6,815,297 B1 | 11/2004 | Krivokapic et al. | |
| RE41,764 E | 9/2010 | Skotnicki et al. | |
| 2004/0180489 A1* | 9/2004 | Sohn ............... | H01L 21/823807 438/199 |
| 2006/0154428 A1 | 7/2006 | Dokumaci | |
| 2006/0237791 A1* | 10/2006 | Doris ................ | H01L 29/66545 257/348 |
| 2007/0252203 A1* | 11/2007 | Zhu .................. | H01L 21/26586 257/345 |
| 2011/0241127 A1 | 10/2011 | Hung et al. | |
| 2011/0254015 A1 | 10/2011 | Doris et al. | |

OTHER PUBLICATIONS

U.S. Appl. No. 13/289,051, Office Action Communication dated Mar. 21, 2014, 19 pages.

U.S. Appl. No. 13/289,051, Notice of Allowance dated Jul. 21, 2014, 8 pages.

\* cited by examiner

BLANKET SHORT CHANNEL ROLL-UP IMPLANT WITH NON-ANGLED LONG CHANNEL COMPENSATING IMPLANT THROUGH PATTERNED OPENING

CROSS-REFERENCE TO RELATED APPLICATIONS

The present invention claims the benefit under 35 U.S.C. §120 as a divisional of presently U.S. patent application Ser. No. 13/289,051 filed on Nov. 4, 2011, now issued as U.S. Pat. No. 8,900,954, the entire teachings of which are incorporated herein by reference.

BACKGROUND

The present invention relates to the manufacture of integrated circuit devices, and more specifically, to controlling threshold voltage of transistors by using a blanket short channel rollup implant combined with a non-angled long channel compensating implant.

In order to increase integrated circuit device performance, it is often desirable to lower the threshold voltage required to make transistors switch from one state to another state. Various implants are utilized in order to lower the threshold voltage of transistors. For example, one common implant is known as a "halo" implant and is created by performing angled implants of dopant species to drive the impurity beneath the gate conductor stack of the transistor.

However, as the size of transistors is reduced and as the density and pitch of transistors is increased (along with the utilization of relatively tall structures such as fin-type field effect transistors (FinFETs)) it becomes more and more difficult to perform angled implants that can reduce threshold voltage by a meaningful amount.

SUMMARY

One exemplary method herein implants a well implant into a substrate, patterns a mask on the substrate (to have at least one opening that exposes a channel region of the substrate) and forms a conformal dielectric layer on the mask and to line the opening. The conformal dielectric layer covers the channel region of the substrate. The exemplary method also forms a conformal gate metal layer on the conformal dielectric layer, implants a compensating implant through the conformal gate metal layer and the conformal dielectric layer into the channel region of the substrate, and forms a gate conductor on the conformal gate metal layer. Additionally, this exemplary method removes the mask to leave a gate stack on the substrate, forms sidewall spacers on the gate stack, and then forms source/drain regions in the substrate partially below the sidewall spacers.

Another exemplary method also implants a blanket well implant into a substrate (the substrate comprises silicon), patterns a mask on the substrate to have at least one opening that exposes a channel region of the substrate, and forms a conformal dielectric layer on the mask and to line the opening. The conformal dielectric layer covers the channel region of the substrate. This additional method forms a conformal gate metal layer on the conformal dielectric layer, and implants a compensating implant through the conformal gate metal layer and the conformal dielectric layer into the channel region of the substrate. Additionally, this method forms a gate conductor on the conformal gate metal layer, forms a cap layer on the gate conductor, and removes the mask to leave a portion of the conformal dielectric layer on the substrate above the channel region, a portion of the conformal gate metal layer on the conformal dielectric layer above the channel region, the gate conductor on the conformal gate metal layer above the channel region, and the cap layer on the gate conductor above the channel region standing as a gate stack on the substrate. The method then implants junction extensions into the substrate adjacent the gate stack, forms sidewall spacers on the gate stack, and forms source/drain regions in the substrate partially below the extensions and partially below the sidewall spacers.

A further exemplary method herein implants a blanket well implant into a semiconductor silicon material substrate. The method patterns a mask on the substrate to have at least one opening, and the opening exposes a channel region of the substrate. The method then forms a conformal dielectric layer on the mask and in the opening. The conformal dielectric layer lines the opening. The conformal dielectric layer covers the channel region of the substrate at the bottom of the opening.

Next, the method forms a conformal gate metal layer on the conformal dielectric layer in the opening and implants a compensating implant, potentially using a non-angled implant process. The compensating implant is blocked by the mask, but passes through the opening. Further, the compensating implant passes through horizontal sections of the conformal gate metal layer and the conformal dielectric layer (but does not pass through vertical sections of the conformal gate metal layer and the conformal dielectric layer) and therefore passes into the channel region of the substrate. The horizontal section of the conformal gate metal layer and the horizontal section of the conformal dielectric layer are parallel to the upper surface of the substrate.

The method then forms a polysilicon gate conductor on the conformal gate metal layer in the opening and forms a cap layer on the gate conductor in the opening. Next, the method removes the mask to leave a portion of the conformal dielectric layer that was in the opening on the substrate above the channel region, a portion of the conformal gate metal layer that was in the opening on the conformal dielectric layer above the channel region, the gate conductor on the conformal gate metal layer above the channel region, and the cap layer on the gate conductor above the channel region standing as a gate stack on the substrate. Then, the method implants junction extensions into the substrate using the gate stack as a self-aligned mask. Following this, the method forms sidewall spacers on the gate stack and implants impurities using the gate stack and sidewall spacers as a self-aligned mask to form conductive source/drain regions in the substrate partially below the extensions and partially below the sidewall spacers.

The blanket well implant is implanted uniformly across the transistor area of the substrate (where the transistor area includes the channel region and the source/drain regions). After implanting the compensating implant 142, forming the junction extensions, and forming the source/drain regions, unaltered portions of the blanket well implant remain in the substrate. These portions of the blanket well implant are positioned between the compensating implant, and the junction extensions and the source/drain regions.

The size of the opening in the mask (and more particularly, the length of the horizontal section of the gate metal layer) controls the length of the gate conductor and the length of the compensating implant. The ratio of the length of the compensating implant to the length of the portions of the blanket well implant is similarly controlled size of the opening in the mask (and more particularly, the length of the horizontal section of the gate metal layer).

The foregoing methods produce a field effect transistor that has a conformal dielectric layer on a semiconductor channel region of a substrate. The conformal dielectric layer has a u-shape when viewed in cross-section. Further, a conformal gate metal layer is on the conformal dielectric layer. Similarly, the conformal gate metal layer has a u-shape when viewed in cross-section, and the u-shape of the conformal gate metal layer fits within the u-shape of the conformal dielectric layer, when viewed in cross-section. Also, a gate conductor is positioned on the conformal gate metal layer. The gate conductor fills the u-shape of the conformal gate metal layer when viewed in cross-section. Further, the conformal dielectric layer, the conformal metal gate layer, and the gate conductor forms a gate stack. Sidewall spacers are on the gate stack, and the sidewall spacers contact vertical sections of the u-shape of the conformal dielectric layer. The vertical sections of the u-shape of the conformal dielectric layer are vertical relative to the horizontal upper surface of the substrate. In addition, conductive source/drain regions are in the substrate. Edges of the source/drain regions are aligned below the sidewall spacers. A compensating implant is in the channel region of the substrate and is aligned below the gate conductor. Edges of the compensating implant are aligned with edges of the gate conductor. Also, a well implant is in the substrate positioned between the compensating implant and the source/drain regions.

The structure further includes a cap on the gate conductor and junction extensions above the source/drain regions. Again, the well implant is positioned between the compensating implant and the junction extensions. The horizontal length of the gate conductor and the horizontal length of the compensating implant are the same. Additionally, the ratio of the horizontal length of the compensating implant to the horizontal length of the portions of the well implant is controlled by the size of the opening in the mask (and more particularly, the length of the horizontal section of the gate metal layer).

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

As mentioned above, it becomes more and more difficult to perform angled implants that can reduce threshold voltage by a meaningful amount as advances are made in other areas of transistor design. In view of such issues, the embodiments herein first perform a blanket implant of a doping species that is especially useful for transistors that have a short channel. In addition, the methodologies described below also implant a compensating implant (that is especially useful for transistors that have a long channel) through a mask before the gate conductor is formed. Through these processes, embodiments herein avoid the need to utilize halo implants, thereby avoiding the need to perform angled implants. Note that the transistor structures discussed below are negative (N-type) field effect transistors; however, as would be understood by those ordinarily skilled in the art, the embodiments discussed herein are applicable to any type of transistor, whether currently known or developed in the future.

Figure 1:
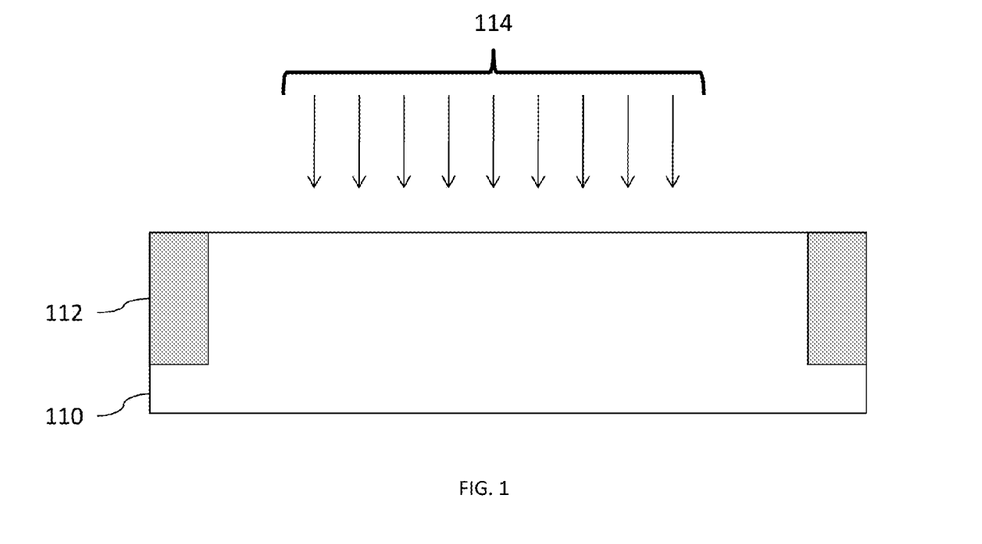
FIG. 1 is a cross-sectional schematic diagram of an integrated circuit device according to embodiments herein.

Referring now to the drawings, FIG. 1 illustrates a substrate 110. A "substrate" herein can comprise any material appropriate for the given purpose (whether now known or developed in the future) and can comprise, for example, Si, SiC, SiGe, SiGeC, Ge alloys, GaAs, In As, TnP, other III-V or II-VI compound semiconductors, or organic semiconductor structures, etc. Thus, for example, the substrate 110 could comprise a silicon substrate or could comprise a silicon-on-insulator substrate (SOI).

In FIG. 1, shallow trench isolation (STI) regions 112 are formed. The "shallow trench isolation" (STI) structures 112 are well-known to those ordinarily skilled in the art and are generally formed by patterning openings/trenches within the substrate and growing or filling the openings with a highly insulating material (this allows different active areas of the substrate to be electrically isolated from one another).

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In addition, as shown in FIG. 1, various impurities may be implanted (as indicated by item 114) into the substrate 110 to change the conducted nature of the substrate. As used herein, "implantation processes" can take any appropriate form (whether now known or developed in the future) and can comprise, for example, ion implantation, etc. For example, such impurities can make the substrate 110 a semiconductor. Alternatively, rather than implanting impurities the substrate can be formed with impurities. In any case, for purposes herein, a "semiconductor" is a material or structure that may include an impurity that allows the material to sometimes be a conductor and sometimes be an insulator, based on electron and hole carrier concentration.

Figure 2:
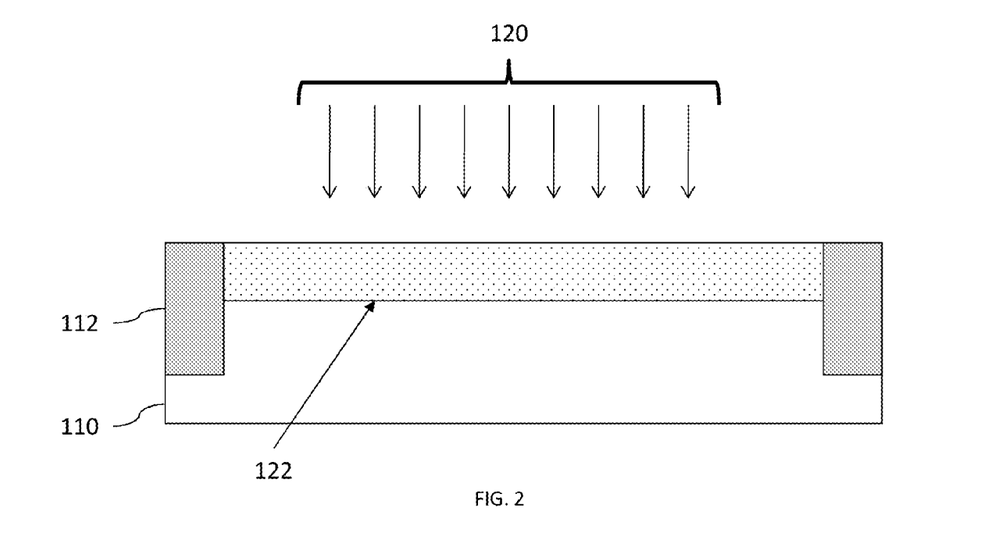
FIG. 2 is a cross-sectional schematic diagram of an integrated circuit device according to embodiments herein.

Referring now to FIG. 2, before forming other structures, the methods herein implant a blanket well implant 122 into a semiconductor silicon material substrate 110 as represented by item 120. The material used for the blanket well implant 122 is a doping species that is especially useful for transistors that have a short channel and can comprise, for example, P-type transistor impurities such as boron, aluminum or gallium, etc. Other possible short channel doping species can include Sb, In, AS, or P.

Figure 3:
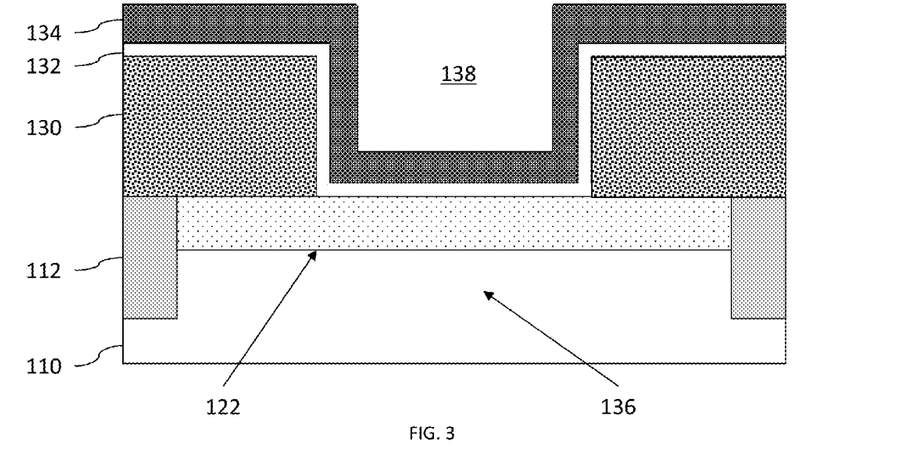
FIG. 3 is a cross-sectional schematic diagram of an integrated circuit device according to embodiments herein.

Referring now to FIG. 3, the methods herein pattern a mask 130 on the substrate 110. The mask 130 is patterned in such a way that it has at least one opening 138, and the opening 138 exposes a channel region 136 of the substrate 110. A hardmask can be formed of any suitable material, whether now known or developed in the future, such as a metal or organic hardmask, that has a hardness greater than the substrate and insulator materials used in the remainder of the structure. As discussed in greater detail below, the channel region 136 will eventually become the semiconductor channel of the transistor.

As also shown in FIG. 3, these methods then form a conformal dielectric layer 132 on the mask 130 and in the opening 138. The conformal dielectric layer 132 lines the opening 138. As also shown in FIG. 3, the conformal dielectric layer 132 covers the channel region 136 of the substrate 110 at the bottom of the opening 138.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

Next, as also shown in FIG. 3, the method forms a conformal gate metal layer 134 on the conformal dielectric layer 132 in the opening 138. Being conformal, the gate metal layer 134 also lines the opening 138 on top of the conformal dielectric layer 132. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Figure 4:
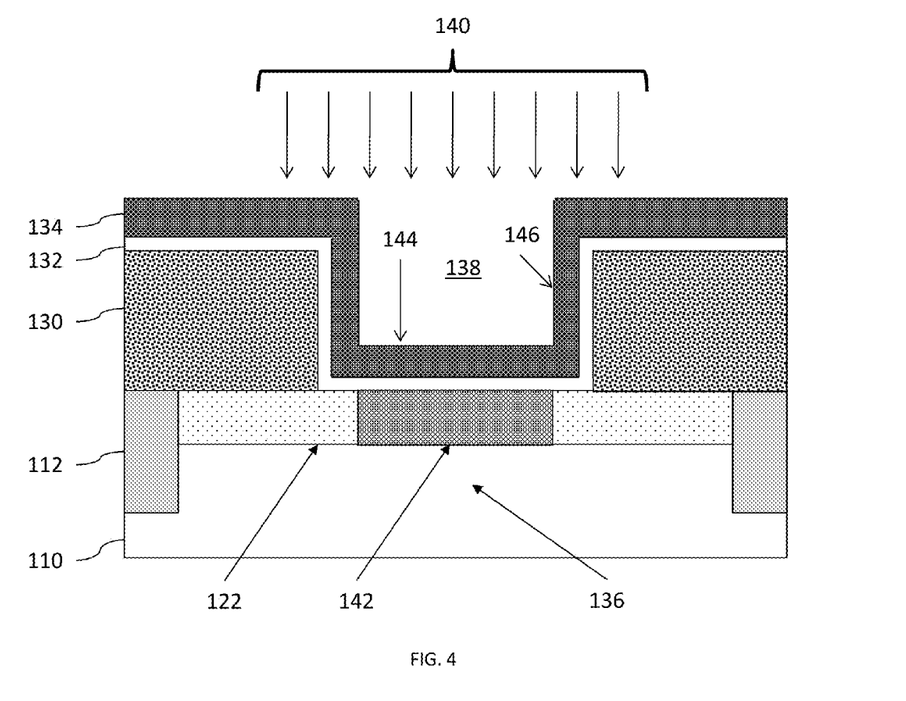
FIG. 4 is a cross-sectional schematic diagram of an integrated circuit device according to embodiments herein.

Next, as shown in FIG. 4, the methods herein implant a compensating implant 142, potentially using a non-angled implant process, as shown by item 140. For example, the implant 140 could comprise an implant that is made perpendicular (e.g., at approximately 90°) to the upper surface of the substrate 110. Alternatively, if desired, the implant 140 could be performed at some angle other than approximately perpendicular to the upper surface of the substrate 110.

The compensating implant 142 is blocked by the mask 130, but passes through the opening 138. Further, the compensating implant 142 passes through horizontal sections 144 of the conformal gate metal layer 134 and the conformal dielectric layer 132 (but does not pass through vertical sections 146 of the conformal gate metal layer 134 and the conformal dielectric layer 132) and therefore passes into the channel region 136 of the substrate 110. The horizontal sections 144 of the conformal gate metal layer 134 and the conformal dielectric layer 132 are parallel to the upper surface of the substrate 110, while the vertical sections 146 are perpendicular to the upper surface of the substrate 110.

The material used for the compensating implant 142 is a doping species that is especially useful for transistors that have a long channel and can comprise, for example, N-type impurities such as antimony, arsenic or phosphorous, etc. Other possible short channel doping species can include Sb, In, AS, or P.

Figure 5:
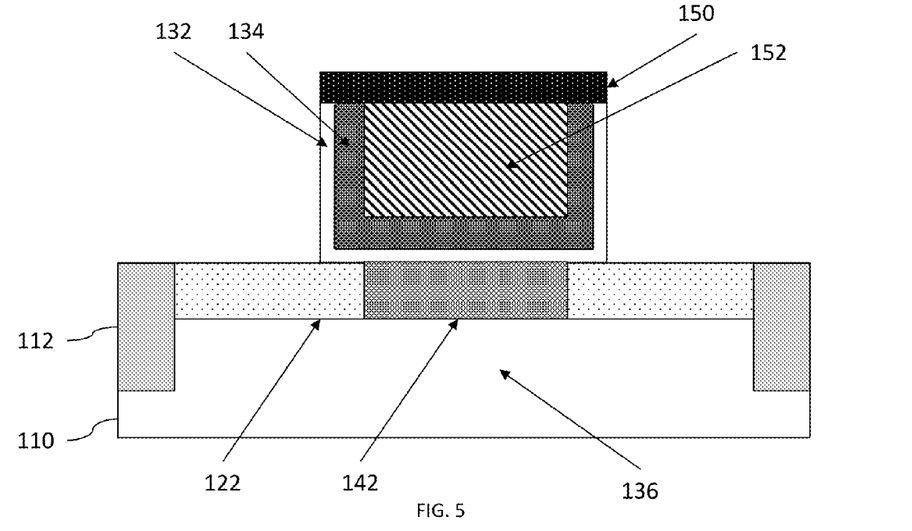
FIG. 5 is a cross-sectional schematic diagram of an integrated circuit device according to embodiments herein.

As shown in FIG. 5, the method then forms a gate conductor 152 (which can be, for example, polysilicon) on the conformal gate metal layer 134 in the opening 138. The gate conductor 152 fills the opening 138. After forming the gate conductor 152, the methods herein then optionally form a cap layer 150 on the gate conductor 152 in the opening 138.

As also shown in FIG. 5, the methods herein remove the mask 130. This leaves the portion of the conformal dielectric layer 132 that was in the opening 138 on the substrate 110 above the channel region 136, a portion of the conformal gate metal layer 134 that was in the opening 138 on the conformal dielectric layer 132 above the channel region 136, the gate conductor 152 on the conformal gate metal layer 134 above the channel region 136, and the cap layer 150 on the gate conductor 152 above the channel region 136 standing as a gate stack on the substrate 110 (as shown in FIG. 5).

Figure 6:
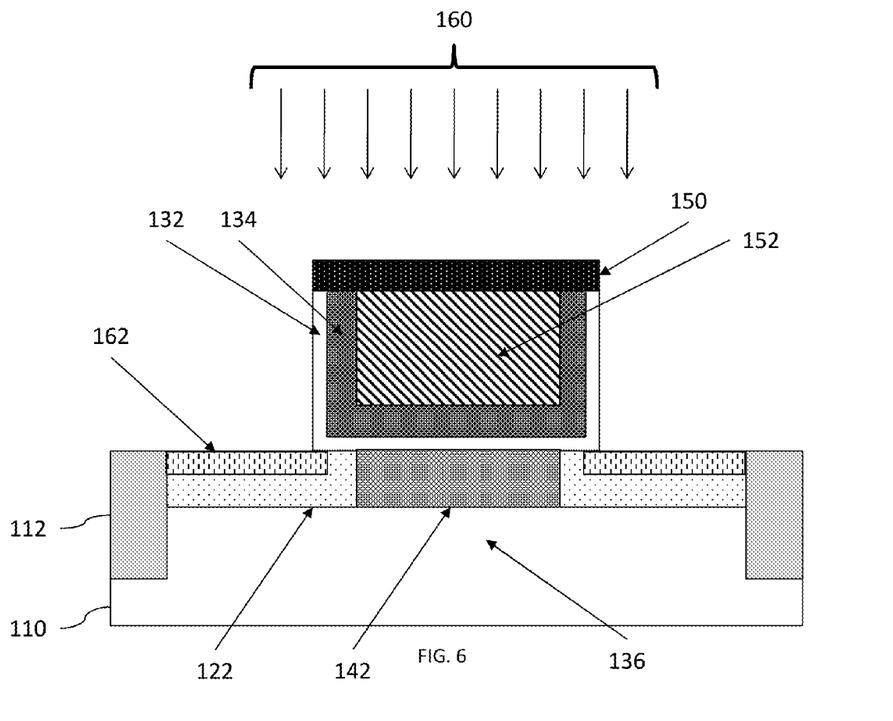
FIG. 6 is a cross-sectional schematic diagram of an integrated circuit device according to embodiments herein.

Then, as shown in FIG. 6, the method implants junction extensions 162 into the substrate 110 using the gate stack as a self-aligned mask 130 (as represented by item 160). The same dopants used in the channel can be used in the junction extensions 162.

Figure 7:
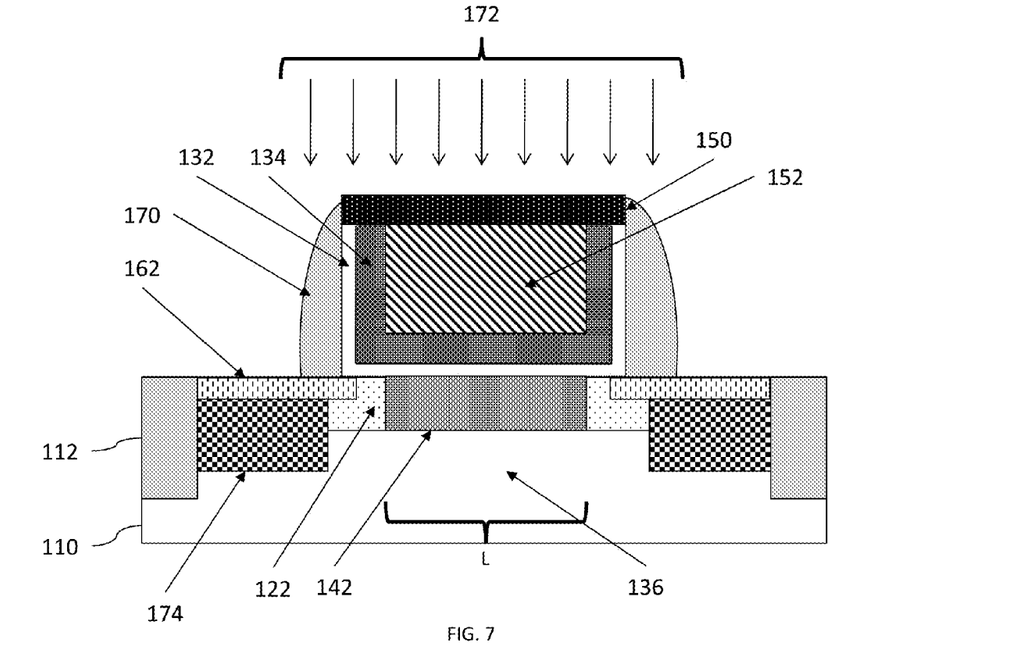
FIG. 7 is a cross-sectional schematic diagram of an integrated circuit device according to embodiments herein.

Following this, as shown in FIG. 7, the method forms sidewall spacers 170 on the gate stack. For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than it removes material from vertical surfaces, thereby leaving insulating material along the vertical sidewalls of structures. This material left on the vertical sidewalls is referred to as sidewall spacers.

As also shown in FIG. 7, the methods herein implant impurities (represented by item 172) using the gate stack and sidewall spacers 170 as a self-aligned mask 130 to form conductive source/drain regions 174 in the substrate 110 partially below the extensions 162 and partially below the sidewall spacers 170. In N-type transistors, the source and drain comprise heavily doped P-type impurities (and the opposite is true for P-type transistors).

The blanket well implant 122 formed in FIG. 2 is implanted uniformly across the transistor area of the substrate 110 (where the transistor area includes the channel region 136 and the source/drain regions 174). After implanting the compensating implant 142, forming the junction extensions 162, and forming the source/drain regions 174, unaltered portions of the blanket well implant 122 remain in the substrate 110. These portions of the blanket well implant 122 are positioned between the compensating implant 142, and the junction extensions 162 and the source/drain regions 174.

Figure 8:
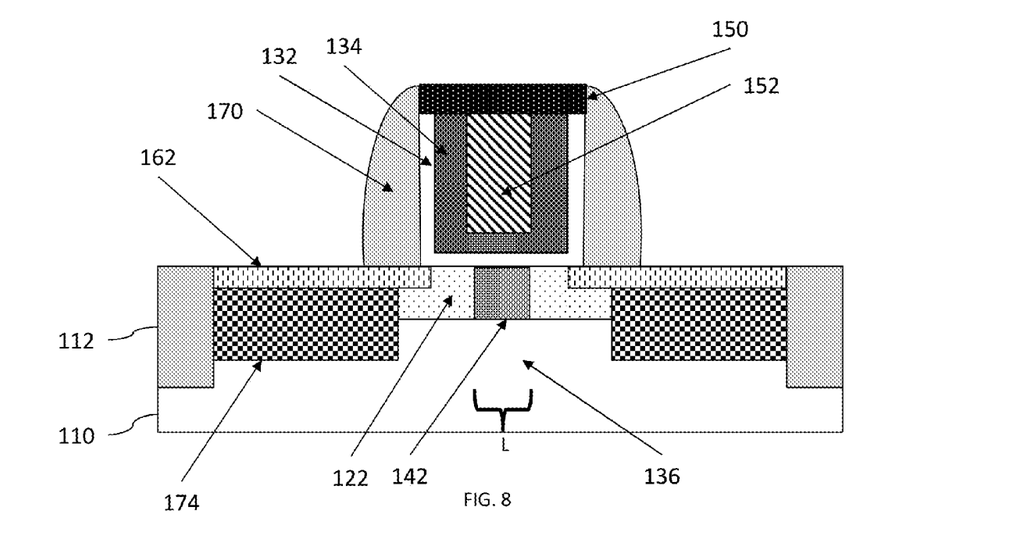
FIG. 8 is a cross-sectional schematic diagram of an integrated circuit device according to embodiments herein.

FIG. 7 illustrates a relatively long channel transistor and FIG. 8 illustrates a relatively short channel transistor. As can be seen in FIGS. 7 and 8, the length "L" of the channel region 136 is shorter in the transistor illustrated in FIG. 8 relative to the transistor shown in FIG. 7. Additionally, the length of the gate conductor 152 and the length of the compensating implant 142 is also shorter in the transistor illustrated in FIG. 8 relative to the transistor shown in FIG. 7. The structure in FIG. 8 can be made the same steps shown in FIGS. 1-7 using a smaller opening 138 in the mask 130.

As shown by the differences between FIGS. 7 and 8, the size of the opening 138 in the mask 130 (and more particularly, the length of the horizontal section 144 of the gate metal layer 134) controls the length of the gate conductor 152 and the length of the compensating implant 142.

As also shown by the comparison of FIGS. 7 and 8, the ratio of the length of the compensating implant 142 to the length of the portions of the blanket well implant 122 is similarly controlled size of the opening 138 in the mask 130 (and more particularly, the length of the horizontal section of the gate metal layer 134).

As shown in FIGS. 7 and 8, the foregoing methods produce the field effect transistor that has the conformal dielectric layer 132 on the semiconductor channel region 136 of the substrate 110. The conformal dielectric layer 132 has the u-shape when viewed in cross-section. In three dimensions, the conformal dielectric layer 132 is deposited in the three-dimensional opening and therefore has an open box or open bucket shape.

Further, the conformal gate metal layer 134 is on the conformal dielectric layer 132. Similarly, the conformal gate metal layer 134 has a u-shape when viewed in cross-section. Again, in three dimensions, the conformal gate metal layer 134 is deposited in the three-dimensional opening and therefore has an open box or open bucket shape. As shown, the u-shape of the conformal gate metal layer 134 fits within the u-shape of the conformal dielectric layer 132, when viewed in cross-section.

Also, the gate conductor 152 is positioned on the conformal gate metal layer 134. The gate conductor 152 fills the u-shape of the conformal gate metal layer 134 when viewed in cross-section (fills the opening as a cube or cylinder shape in three dimensions). Further, the conformal dielectric layer 132, the conformal metal gate layer, and the gate conductor 152 forms the gate stack.

Sidewall spacers 170 are on the gate stack, and the sidewall spacers 170 contact vertical sections of the u-shape of the conformal dielectric layer 132. The vertical sections 146 of the u-shape of the conformal dielectric layer 132 are vertical relative to the horizontal upper surface of the substrate 110. In addition, conductive source/drain regions 174 are in the substrate 110. Edges of the source/drain regions 174 are aligned below the sidewall spacers 170.

The compensating implant 142 is in the channel region 136 of the substrate 110 and is aligned below the gate conductor 152. Edges of the compensating implant 142 are aligned with edges of the gate conductor 152. Also, the well implant 122 is in the substrate 110 positioned between the compensating implant 142 and the source/drain regions 174.

The structure further includes the cap on the gate conductor 152 and junction extensions 162 above the source/drain regions 174. Again, the well implant 122 is positioned between the compensating implant 142 and the junction extensions 162. The horizontal length of the gate conductor 152 and the horizontal length of the compensating implant 142 are the same. Additionally, the ratio of the horizontal length of the compensating implant 142 to the horizontal length of the portions of the well implant 122 is controlled by the size of the opening 138 in the mask 130 (and more particularly, the length of the horizontal section of the gate metal layer 134).

Within such a transistor, the semiconductor (or channel region) is positioned between a conductive "source" region and a similarly conductive "drain" region and when the semiconductor is in a conductive state, the semiconductor allows electrical current to flow between the source and drain. The "gate" is a conductive element that is electrically separated from the semiconductor by the "gate oxide" (which is an insulator) and current/voltage within the gate changes the conductivity of the channel region of the transistor.

The doping within the substrate will vary depending upon the type of transistor desired to be produced. For example, a positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A field effect transistor comprising:
    a conformal dielectric layer on a semiconductor channel region of a substrate, said conformal dielectric layer having a u-shape when viewed in cross-section;
    a conformal gate metal layer on said conformal dielectric layer, said conformal gate metal layer having a u-shape when viewed in cross-section, said u-shape of said conformal gate metal layer fitting within said u-shape of said conformal dielectric layer, when viewed in cross-section;
    a gate conductor positioned on said conformal gate metal layer, said gate conductor filling said u-shape of said conformal gate metal layer when viewed in cross-section, and said conformal dielectric layer, said conformal gate metal layer, and said gate conductor forming a gate stack;
    sidewall spacers on said gate stack, said sidewall spacers contacting vertical sections of said conformal dielectric layer, said vertical sections of said conformal dielectric layer being vertical relative to a horizontal upper surface of said substrate;
    conductive source/drain regions in said substrate, said source/drain regions having edges below said sidewall spacers;
    a compensating implant in said channel region of said substrate aligned below said gate conductor, said compensating implant having vertical edges that are essentially aligned with vertical interfaces between said gate conductor and said conformal gate metal layer; and,
    portions of a well implant in said substrate positioned between said compensating implant and said source/drain regions.

2. The field effect transistor according to claim 1, said gate conductor and said compensating implant having approximately equal horizontal lengths.

3. The field effect transistor according to claim 1, a ratio of a horizontal length of said compensating implant to a horizontal length of said portions of said well implant being controlled by a length of a horizontal portion of said conformal gate metal layer.

4. The field effect transistor according to claim 1, further comprising a cap on said gate conductor.

5. The field effect transistor according to claim 1, further comprising junction extensions above said source/drain regions, said well implant being positioned between said compensating implant and said junction extensions.

6. The field effect transistor according to claim 1, said compensating implant and said well implant having approximately equal depths as measured from a top surface of said substrate and said source/drain regions having a depth from said top surface of said substrate that is greater than said approximately equal depths of said compensating implant and said well implant.

7. The field effect transistor according to claim 1, said well implant being doped with P-type impurities and said compensating implant being doped with N-type impurities.

8. A field effect transistor comprising:
    a substrate;
    shallow trench isolation regions in said substrate;
    a channel region in said substrate between said shallow trench isolation regions;
    a conformal dielectric layer on said channel region, said conformal dielectric layer having a u-shape when viewed in cross-section;
    a conformal gate metal layer on said conformal dielectric layer, said conformal gate metal layer having a u-shape when viewed in cross-section, said u-shape of said conformal gate metal layer fitting within said u-shape of said conformal dielectric layer, when viewed in cross-section;
    a gate conductor positioned on said conformal gate metal layer, said gate conductor filling said u-shape of said conformal gate metal layer when viewed in cross-section, and said conformal dielectric layer, said conformal gate metal layer, and said gate conductor forming a gate stack;
    sidewall spacers on said gate stack, said sidewall spacers contacting vertical sections of said conformal dielectric layer, said vertical sections of said conformal dielectric layer being vertical relative to a horizontal upper surface of said substrate;
    a well implant in said substrate extending laterally between said shallow trench isolation regions, said well implant being shallower in depth than said shallow trench isolation regions;
    source/drain regions in said substrate adjacent to said shallow trench isolation regions such that said channel region is positioned laterally between said source/drain region, said source/drain regions having edges below said sidewall spacers and said source/drain regions extending vertically through said well implant into a lower portion of said substrate below said well implant; and,
    a compensating implant in said substrate aligned below said gate conductor at said channel region,
        said compensating implant extending vertically through said well implant to said lower portion of said substrate below said well implant such that vertical interfaces between said compensating implant and said well implant are essentially aligned with vertical interfaces between said gate conductor and said conformal gate metal layer, such that said source/drain regions are physically separated from said compensating implant by portions of said well implant, and such that said portions of said well implant are immediately adjacent to said conformal dielectric layer and extend laterally partially below said conformal gate metal layer.

9. The field effect transistor according to claim 8, said gate conductor and said compensating implant having approximately equal horizontal lengths.

10. The field effect transistor according to claim 8, a ratio of a horizontal length of said compensating implant to a horizontal length of said portions of said well implant being controlled by a length of a horizontal portion of said conformal gate metal layer.

11. The field effect transistor according to claim 8, further comprising a cap on said gate conductor.

12. The field effect transistor according to claim 8, further comprising junction extensions in said substrate adjacent to said shallow trench isolation regions, above said source/drain regions and extending laterally to below said gate stack, said portions of said well implant being positioned between said compensating implant and said junction extensions.

13. The field effect transistor according to claim 8, said compensating implant and said well implant having approximately equal depths as measured from a top surface of said substrate.

14. The field effect transistor according to claim 8, said well implant being doped with P-type impurities and said compensating implant being doped with N-type impurities.

15. A field effect transistor comprising:
a substrate;
shallow trench isolation regions in said substrate;
a channel region in said substrate between said shallow trench isolation regions;
a conformal dielectric layer on said channel region, said conformal dielectric layer having a u-shape when viewed in cross-section;
a conformal gate metal layer on said conformal dielectric layer, said conformal gate metal layer having a u-shape when viewed in cross-section, said u-shape of said conformal gate metal layer fitting within said u-shape of said conformal dielectric layer, when viewed in cross-section;
a gate conductor positioned on said conformal gate metal layer, said gate conductor filling said u-shape of said conformal gate metal layer when viewed in cross-section, and said conformal dielectric layer, said conformal gate metal layer, and said gate conductor forming a gate stack;
sidewall spacers on said gate stack, said sidewall spacers contacting vertical sections of said conformal dielectric layer, said vertical sections of said conformal dielectric layer being vertical relative to a horizontal upper surface of said substrate;
a well implant in said substrate extending laterally between said shallow trench isolation regions, said well implant being shallower in depth than said shallow trench isolation regions and being doped with P-type impurities;
source/drain regions in said substrate adjacent to said shallow trench isolation regions such that said channel region is positioned laterally between said source/drain region, said source/drain regions having edges below said sidewall spacers and said source/drain regions extending vertically through said well implant into a lower portion of said substrate below said well implant; and,
a compensating implant in said substrate aligned below said gate conductor at said channel region, said compensating implant being doped with N-type impurities and said compensating implant extending vertically through said well implant to said lower portion of said substrate below said well implant such that vertical interfaces between said compensating implant and said well implant are essentially aligned with vertical interfaces between said gate conductor and said conformal gate metal layer, such that said source/drain regions are physically separated from said compensating implant by portions of said well implant and such that said portions of said well implant are immediately adjacent to said conformal dielectric layer and extend laterally partially below said conformal gate metal layer.

16. The field effect transistor according to claim 15, said gate conductor and said compensating implant having approximately equal horizontal lengths.

17. The field effect transistor according to claim 15, a ratio of a horizontal length of said compensating implant to a horizontal length of said portions of said well implant being controlled by a length of a horizontal portion of said conformal gate metal layer.

18. The field effect transistor according to claim 15, further comprising a cap on said gate conductor.

19. The field effect transistor according to claim 15, further comprising junction extensions in said substrate adjacent to said shallow trench isolation regions, above said source/drain regions and extending laterally to below said gate stack, said portions of said well implant being positioned between said compensating implant and said junction extensions.

20. The field effect transistor according to claim 15, said compensating implant and said well implant having approximately equal depths as measured from a top surface of said substrate.

* * * * *